US009666929B2

(12) United States Patent
Lin et al.

(10) Patent No.: US 9,666,929 B2
(45) Date of Patent: May 30, 2017

(54) BALUN FOR CONVERTING BETWEEN MULTIPLE DIFFERENTIAL SIGNAL PAIRS AND A SINGLE ENDED SIGNAL

(71) Applicant: National Chi Nan University, Puli, Nantou (TW)

(72) Inventors: Yo-Sheng Lin, Nantou (TW); Chien-Chin Wang, Nantou (TW)

(73) Assignee: NATIONAL CHI NAN UNIVERSITY, Puli, Nantou (TW)

( * ) Notice: Subject to any disclaimer, the term of this patent is extended or adjusted under 35 U.S.C. 154(b) by 70 days.

(21) Appl. No.: 14/887,379

(22) Filed: Oct. 20, 2015

(65) Prior Publication Data

US 2016/0126612 A1 May 5, 2016

(30) Foreign Application Priority Data

Nov. 5, 2014 (TW) ............................. 103138370 A

(51) Int. Cl.
*H03H 7/42* (2006.01)
*H01P 5/10* (2006.01)
*H01P 5/12* (2006.01)

(52) U.S. Cl.
CPC . *H01P 5/10* (2013.01); *H01P 5/12* (2013.01)

(58) Field of Classification Search
CPC .................................... H03H 7/42; H01P 5/10
USPC ............................................ 333/25, 26, 246
See application file for complete search history.

(56) References Cited

U.S. PATENT DOCUMENTS 7,274,267 B2 * 9/2007 Saitou ........................ H01P 5/10 333/238
7,468,640 B2 * 12/2008 Nosaka ..................... H01P 5/10 333/25
7,561,012 B2 * 7/2009 Fukunaga ............... H01P 1/205 333/204
8,064,871 B2 * 11/2011 Kuo ..................... H03D 9/0633 327/355
8,290,453 B2 10/2012 Yoshihara
8,964,605 B1 * 2/2015 Ansari ..................... H03H 7/42 370/278

* cited by examiner

*Primary Examiner* — Dean Takaoka
(74) *Attorney, Agent, or Firm* — Merchant & Gould P.C.

(57) ABSTRACT

A balun includes a first transmission line and a number (N) of second transmission lines. The first transmission line includes an end terminal for receiving or outputting a signal with a target wavelength, and having a length of half the target wavelength. Each of the second transmission lines is disposed adjacent to and spaced apart from the first transmission line so as to establish electromagnetic coupling therebetween, and includes first and second end terminals for cooperatively outputting or receiving a differential signal pair with the target wavelength.

12 Claims, 14 Drawing Sheets

BALUN FOR CONVERTING BETWEEN MULTIPLE DIFFERENTIAL SIGNAL PAIRS AND A SINGLE ENDED SIGNAL

CROSS-REFERENCE TO RELATED APPLICATION

This application claims priority of Taiwanese Application No. 103138370, filed on Nov. 5, 2014.

FIELD

The disclosure relates to a balun, and more particularly to a balun for converting between multiple differential signal pairs and a single-ended signal.

BACKGROUND

Referring to FIG. 1, a conventional power amplifier device includes three Wilkinson dividers 11-13, six power amplifiers 21-26, and three Wilkinson combiners 31~33. Each of the power amplifiers 21-26 has a power gain of A.

The Wilkinson divider 11 divides an input signal with a power of $P_i$ into first and second signals, each with a power of $P_i/2$. Each of the power amplifiers 21, 22 amplifies a respective one of the first and second signals by the power gain to obtain a respective one of first and second amplification signals, which has a power of $(P_i/2)\times A$. The Wilkinson divider 12 divides the first amplification signal into third and fourth signals, each with a power of $(P_i/4)\times A$. The Wilkinson divider 13 divides the second amplification signal into fifth and sixth signals, each with a power of $(P_i/4)\times A$. Each of the power amplifiers 23-26 amplifies a respective one of the third to sixth signals by the power gain to obtain a respective one of third, fourth, fifth and sixth amplification signals, which has a power of $(P_i/4)\times A^2$. The Wilkinson combiner 31 combines the third and fourth amplification signals to obtain a seventh signal with a power of $(P_i/2)\times A^2$. The Wilkinson combiner 32 combines the fifth and sixth amplification signals to obtain an eighth signal with a power of $(P_i/2)\times A^2$. The Wilkinson combiner 33 combines the seventh and eighth signals to obtain an output signal with a power of $P_i\times A^2$.

However, since three Wilkinson dividers 11-13 are required to divide the input signal into four signals, and since three Wilkinson combiners 31-33 are required to combine four signals into the output signal, the conventional power amplifier device disadvantageously has a relatively large area and a relatively high cost.

SUMMARY

Therefore, an object of the disclosure is to provide a balun that can alleviate at least one of the drawbacks of the prior art.

According to the disclosure, the balun includes a first transmission line and a number (N) of second transmission lines.

The first transmission line includes an end terminal for receiving or outputting a signal with a target wavelength, and has a length of half the target wavelength.

Each of the second transmission lines is disposed adjacent to and spaced apart from the first transmission line so as to establish electromagnetic coupling therebetween, includes a first end terminal and a second end terminal for cooperatively outputting or receiving a differential signal pair with the target wavelength, and a grounded central terminal, and has a first length that is between the first end terminal and the central terminal thereof and that equals a quarter of the target wavelength, and a second length that is between the second end terminal and the central terminal thereof and that equals a quarter of the target wavelength, where N is an integer greater than or equal to two.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
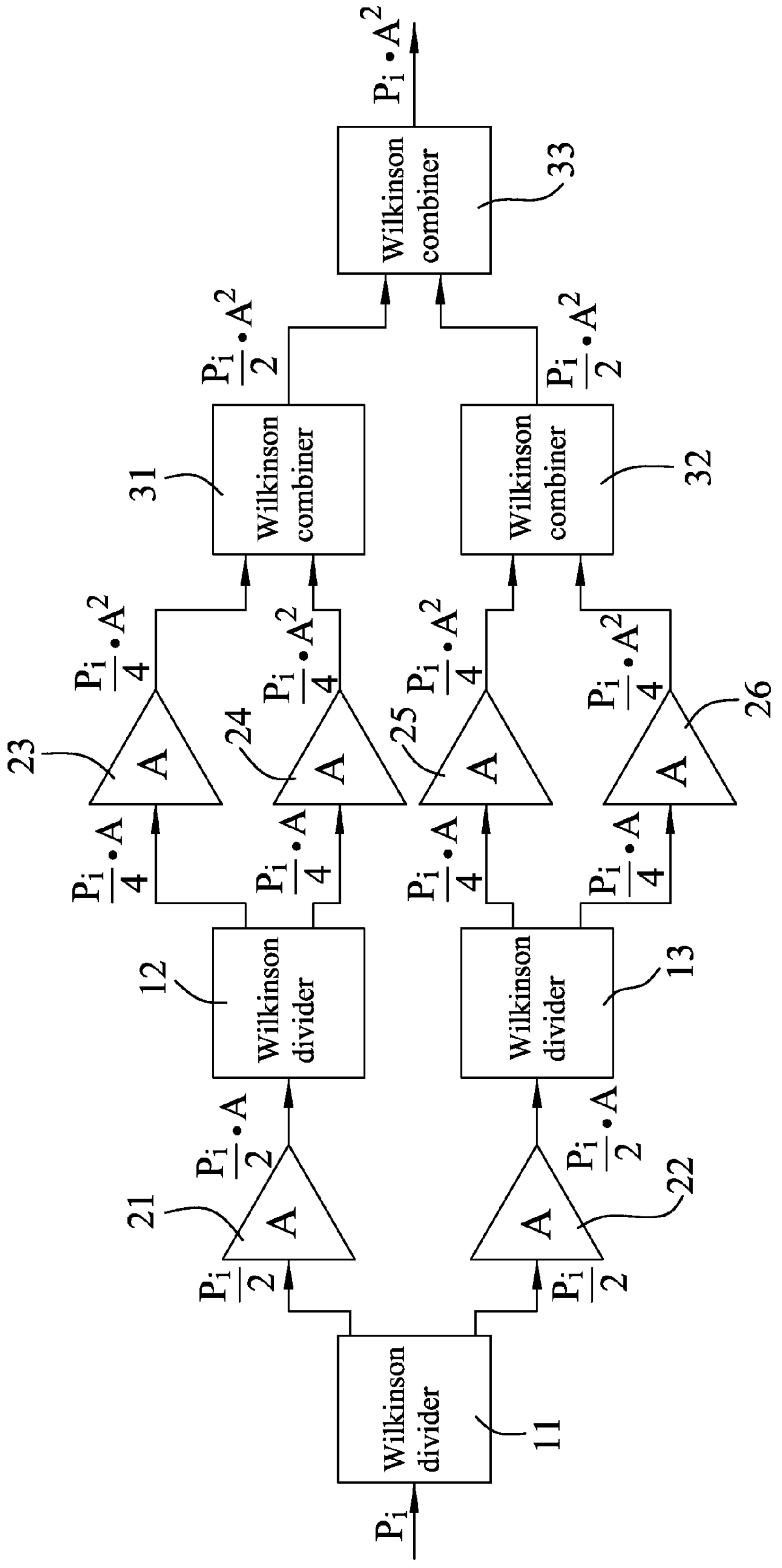
FIG.1 PRIOR ART
FIG. 1 is a circuit block diagram illustrating a conventional power amplifier device.

Before the present disclosure is described in greater detail with reference to the accompanying embodiments, it should be noted herein that like elements are denoted by the same reference numerals throughout the disclosure.

Figure 2:
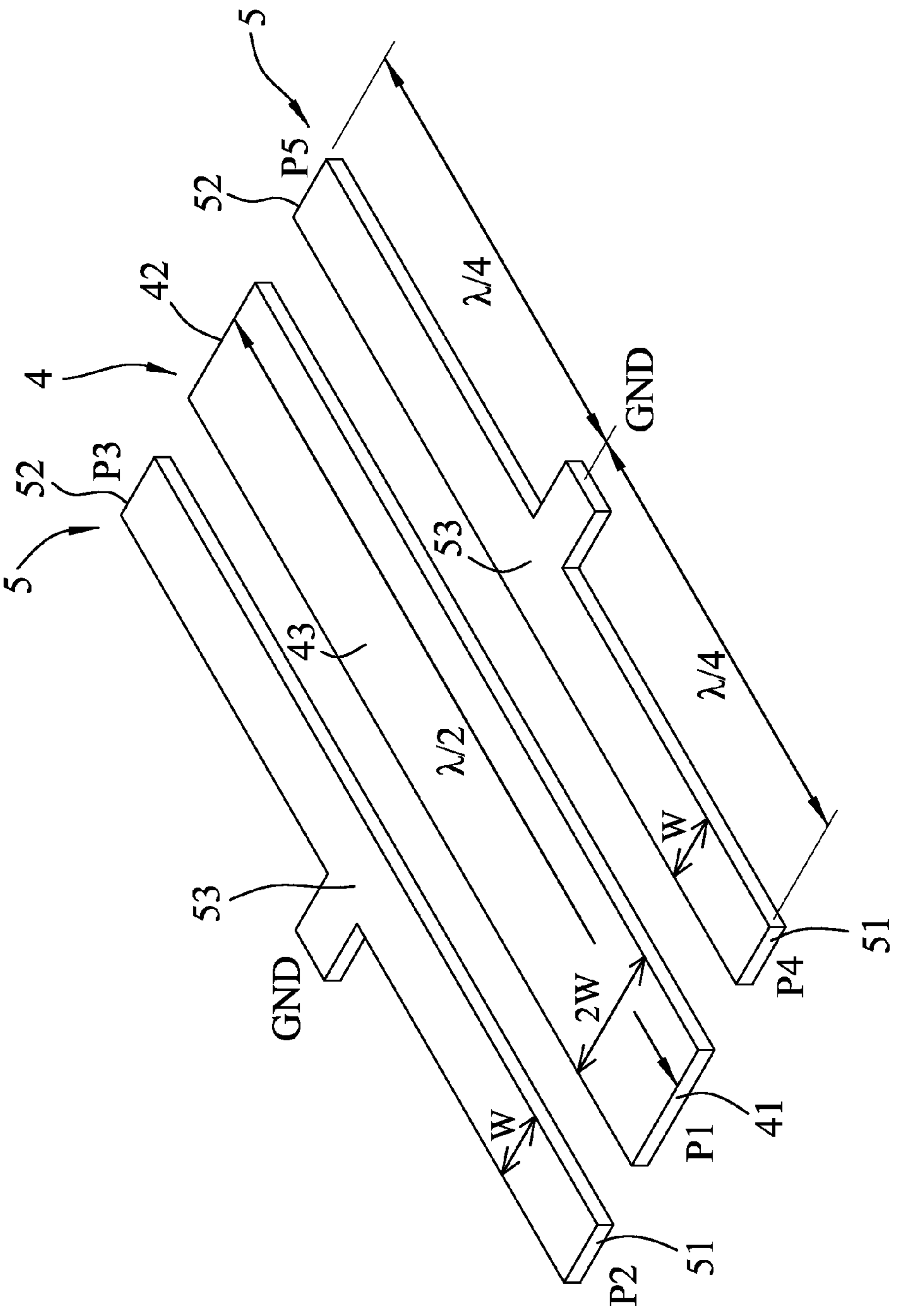
FIG. 2 is a structural diagram illustrating a first embodiment of a balun according to this disclosure.

Referring to FIG. 2, a first embodiment of a balun according to this disclosure includes a first transmission line 4 and a number (N) of second transmission lines 5, where N is an integer greater than or equal to two. In this embodiment, N=2.

The first transmission line 4 includes a first end terminal 41 for receiving or outputting a signal with a target wavelength of λ, a second end terminal 42, and a central terminal 43, and has a length of half the target wavelength (i.e., λ/2) and a width of N×W (i.e., 2W in this embodiment).

Each of the second transmission lines 5 is disposed adjacent to and spaced apart from the first transmission line 4, for example, by 0.5 μm to 5 μm, so as to establish electromagnetic coupling therebetween. In this embodiment, the first transmission line 4 and the second transmission lines 5 are aligned with each other. Each of the second transmission lines 5 includes first and second end terminals 51, 52 for cooperatively outputting or receiving a differential signal pair with the target wavelength, and a grounded central terminal 53, and has a first length that is between the first end terminal 51 and the central terminal 53 thereof and that equals a quarter of the target wavelength (i.e., λ/4), a second length that is between the second end terminal 52 and the central terminal 53 thereof and that equals a quarter of the target wavelength (i.e., λ/4), and a width that is 1/N times that of the first transmission line (i.e., W). In some embodiments, the first and second transmission lines 4, 5 may have thicknesses ranging between 0.5 μm and 5 μm.

In this embodiment, the first and second transmission lines 4, 5 straightly extend in the same longitudinal direction and are parallel to each other with the first end terminal 51, the second end terminal 52 and the central terminal 53 of each second transmission line 5 respectively aligned with the first end terminal 41, the second end terminal 42 and the central terminal 43 of the first transmission line 4. In addition, the first and second transmission lines 4, 5 are coplanar with each other, the first transmission line 4 is disposed between the second transmission lines 5, and the second transmission lines 5 are symmetrical with respect to the first transmission line 4.

When the balun of this embodiment is used as a balanced to unbalanced converter, each of the second transmission lines 5 receives respectively at the first and second end terminals 51, 52 thereof a first input signal and a second input signal that cooperatively constitute a differential input signal pair with the target wavelength. Each of the second transmission lines 5 transmits thereon the first and second input signals that are anti-phase with each other respectively from the first and second end terminals 51, 52 thereof to the central terminal 53 thereof, thereby making a phase difference between the first and second input signals equal zero (i.e., the first and second input signals become in-phase with each other) when the first and second input signals reach the central terminal 53. The first transmission line 4 receives from each of the second transmission lines 5 via electromagnetic coupling the first and second input signals that are in-phase with each other, combines the first and second input signals received from the second transmission lines 5 into a single-ended output signal with the target wavelength, and outputs the output signal at the first end terminal 41 thereof.

When the balun of this embodiment is used as an unbalanced to balanced converter, the first transmission line 4 receives at the first end terminal 41 thereof a single-ended input signal with the target wavelength. The second transmission lines 5 receive the input signal from the first transmission line 4 via electromagnetic coupling, thereby resulting in an equal division of a power of the input signal between the second transmission lines 5. Each of the second transmission lines 5 divides the received input signal into first and second output signals that are in-phase with each other and that have equal powers. Each of the second transmission lines 5 transmits thereon the first and second output signals that are in-phase with each other from the central terminal 53 thereof respectively to the first and second end terminals 51, 52 thereof, thereby making a phase difference between the first and second output signals equal 180° (i.e., the first and second output signals cooperatively constitute a differential output signal pair with the target wavelength) when the first and second output signals respectively reach the first and second end terminals 51, 52. Each of the second transmission lines 5 outputs the first and second output signals respectively at the first and second end terminals 51, 52 thereof.

Figure 3:
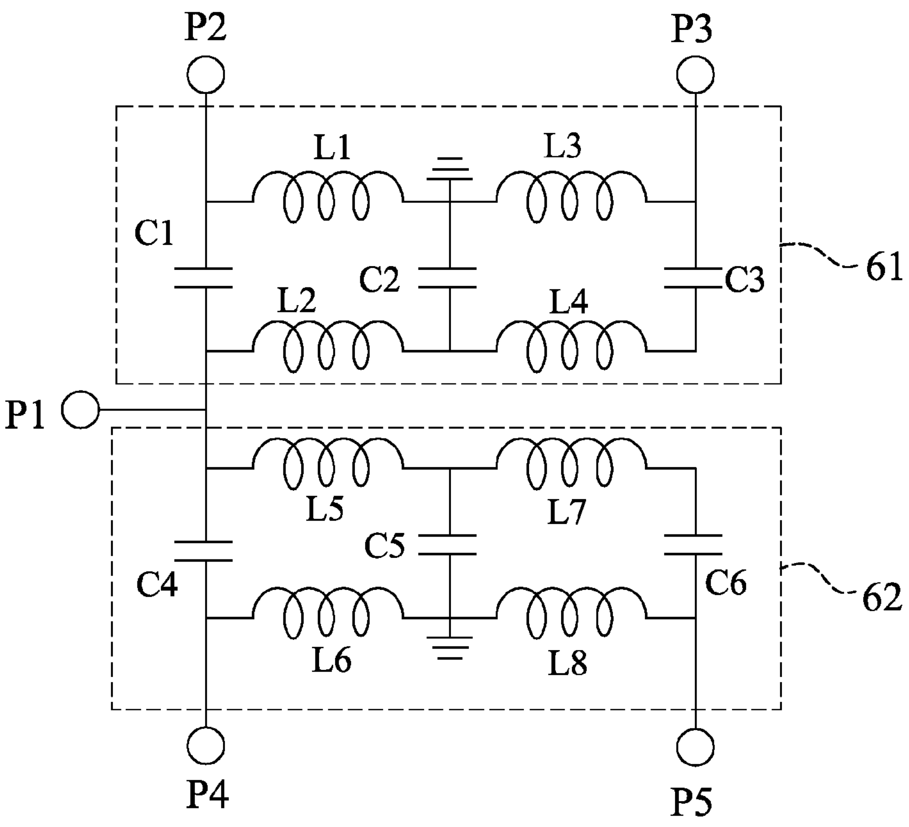
FIG. 3 is a circuit diagram illustrating an equivalent circuit of the first embodiment.
Figure 4:
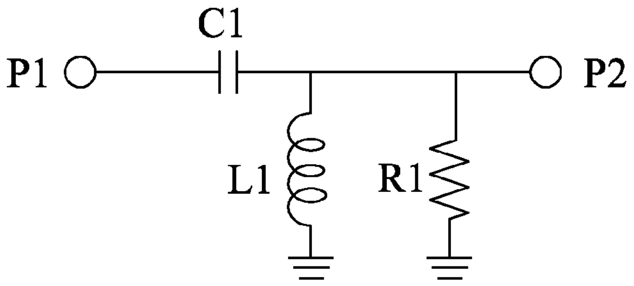
FIG. 4 is a circuit diagram illustrating a portion of the equivalent circuit between first and second ports of the first embodiment and a first resistor coupled to the second port.
Figure 5:
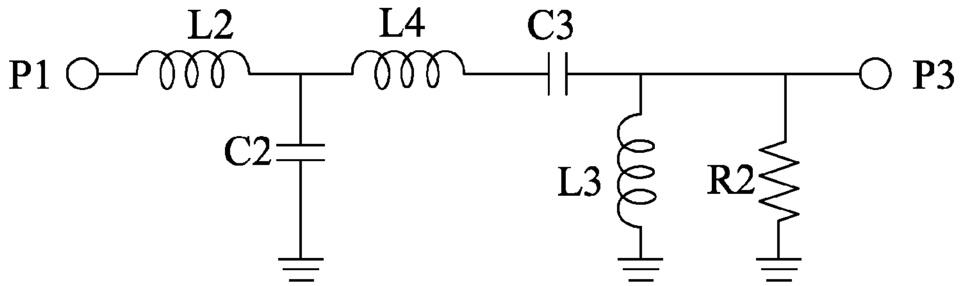
FIG. 5 is a circuit diagram illustrating a portion of the equivalent circuit between the first port and a third port of the first embodiment and a second resistor coupled to the third port.
Figure 6:
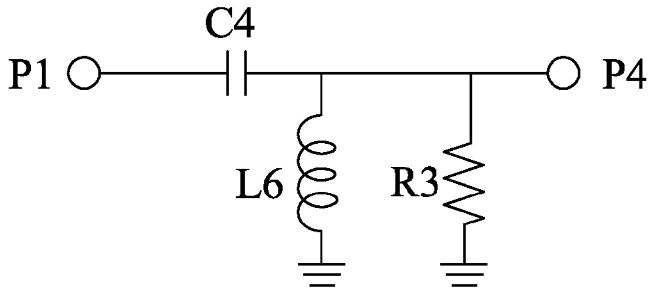
FIG. 6 is a circuit diagram illustrating a portion of the equivalent circuit between the first port and a fourth port of the first embodiment and a third resistor coupled to the fourth port.
Figure 7:
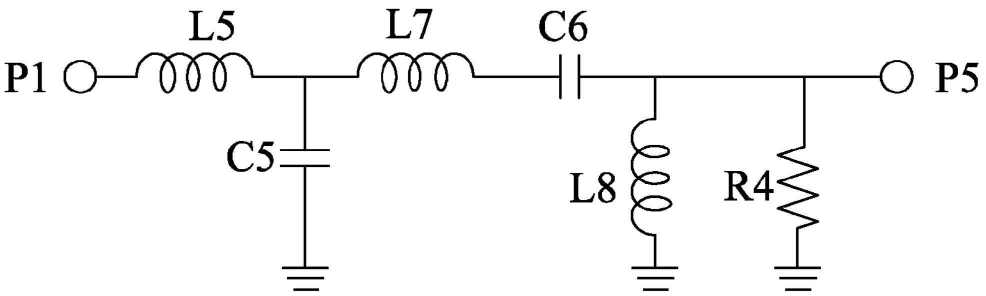
FIG. 7 is a circuit diagram illustrating a portion of the equivalent circuit between the first port and a fifth port of the first embodiment and a fourth resistor coupled to the fifth port.

FIG. 3 illustrates an equivalent circuit of the balun of this embodiment. Referring to FIGS. 2 and 3, in order to facilitate description of this embodiment, the first end terminal 41 of the first transmission line 4, the first and second end terminals 51, 52 of a first one of the second transmission lines 5, and the first and second end terminals 51, 52 of a second one of the second transmission lines 5 are respectively referred to as a first port (P1), a second port (P2), a third port (P3), a fourth port (P4) and a fifth port (P5) hereinafter. The equivalent circuit includes a first unit 61 and a second unit 62.

The first unit 61 is coupled among the first, second and third ports (P1, P2, P3), and includes a first capacitor (C1), a second capacitor (C2), a third capacitor (C3), a first inductor (L1), a second inductor (L2), a third inductor (L3) and a fourth inductor (L4).

The first capacitor (C1) is formed between the first port (P1) and the second port (P2), and has a capacitance of C. The second capacitor (C2) is formed between the central terminal 43 of the first transmission line 4 and the central terminal 53 of the first one of the second transmission lines 5, and has a capacitance of 2C. The third capacitor (C3) is formed between the second end terminal 42 of the first transmission line 4 and the third port (P3), and has a capacitance of C. The first inductor (L1) corresponds to a first half of the first one of the second transmission lines 5 between the second port (P2) and the central terminal 53, and has an inductance of L. The second inductor (L2) corresponds to a first quarter of the first transmission line 4 that is between the first port (P1) and the central terminal 43 and that is adjacent to the first one of the second transmission lines 5, and has an inductance of L. The third inductor (L3) corresponds to a second half of the first one of the second transmission lines 5 between the third port (P3) and the central terminal 53, and has an inductance of L. The fourth inductor (L4) corresponds to a second quarter of the first transmission line 4 that is between the second end terminal 42 and the central terminal 43 and that is adjacent to the first one of the second transmission lines 5, and has an inductance of L.

The second unit 62 is coupled among the first, fourth and fifth ports (P1, P4, P5), and includes a fourth capacitor (C4), a fifth capacitor (C5), a sixth capacitor (C6), a fifth inductor (L5), a sixth inductor (L6), a seventh inductor (L7) and an eighth inductor (L8).

The fourth capacitor (C4) is formed between the first port (P1) and the fourth port (P4), and has a capacitance of C. The fifth capacitor (C5) is formed between the central terminal 43 of the first transmission line 4 and the central terminal 53 of the second one of the second transmission lines 5, and has a capacitance of 2C. The sixth capacitor (C6) is formed between the second end terminal 42 of the first transmission line 4 and the fifth port (P5), and has a capacitance of C. The fifth inductor (L5) corresponds to a third quarter of the first transmission line 4 that is between the first port (P1) and the central terminal 43 and that is adjacent to the second one of the second transmission lines 5, and has an inductance of L. The sixth inductor (L6) corresponds to a first half of the second one of the second transmission lines 5 between the fourth port (P4) and the central terminal 53, and has an inductance of L. The seventh inductor (L7) corresponds to a fourth quarter of the first transmission line 4 that is between the second end terminal 42 and the central terminal 43 and that is adjacent to the second one of the second transmission lines 5, and has an inductance of L. The eighth inductor (L8) corresponds to a second half of the second one of the second transmission lines 5 between the fifth port (P5) and the central terminal 53, and has an inductance of L.

Referring to FIGS. 4 to 7, when the balun of this embodiment is used as the unbalanced to balanced converter, the second to fifth ports (P2~P5) are respectively terminated with first, second, third and fourth resistors (R1, R2, R3, R4), each of which has a resistance of R (e.g., 50Ω). In this case, the first capacitor (C1), the first inductor (L1) and the first resistor (R1) constitute a high pass filter; the second and third capacitors (C2, C3), the second, third and fourth inductors (L2, L3, L4) and the second resistor (R2) constitute a band pass filter; the fourth capacitor (C4), the sixth inductor (L6) and the third resistor (R3) constitute a high pass filter; and the fifth and sixth capacitors (C5, C6), the fifth, seventh and eighth inductors (L5, L7, L8) and the fourth resistor (R4) constitute a band pass filter.

The balun of this embodiment is configured such that ideally $\omega L=1/\omega C=2R$, where $\omega=2\pi f=2\pi\times(3\times10^8/\lambda)$, and such that an impedance seen into the balun from each of the second to fifth ports (P2~P5) thereof ideally equals R (i.e., no reflection occurs, and a scattering parameter (S(1,1)) at the first port (P1) equals zero). In this case, scattering parameters (S(2,1), S(3,1), S(4,1), S(5,1)) from the first port (P1) respectively to the second to fifth ports (P2~P5) can be expressed by the following equations:

$$S(2,1)=\frac{V2}{V1}=S(4,1)=\frac{V4}{V1}=\frac{j\omega L\,//\,R}{j\omega L\,//\,R+\frac{1}{j\omega C}}=\frac{1}{2}\angle 90^\circ,\text{ and}$$

$$S(3,1)=\frac{V3}{V1}=S(5,1)=\frac{V5}{V1}=\frac{\frac{1}{2j\omega C+\frac{1}{R}+\frac{1}{j\omega L}}}{\frac{1}{2j\omega C+\frac{1}{R}+\frac{1}{j\omega L}}+j\omega L}=\frac{1}{2}\angle-90^\circ,$$

where Vm denotes a voltage at the $m^{th}$ port (Pm), and $1\leq m\leq 5$. It is known from these equations that the output signals outputted respectively at the second to fifth ports (P2-P5) ideally have equal amplitudes, that a phase difference between the output signals outputted respectively at the second and third ports (P2, P3) is ideally 180°, and that a phase difference between the output signals outputted respectively at the fourth and fifth ports (P4, P5) is ideally 180°.

Figure 8A:
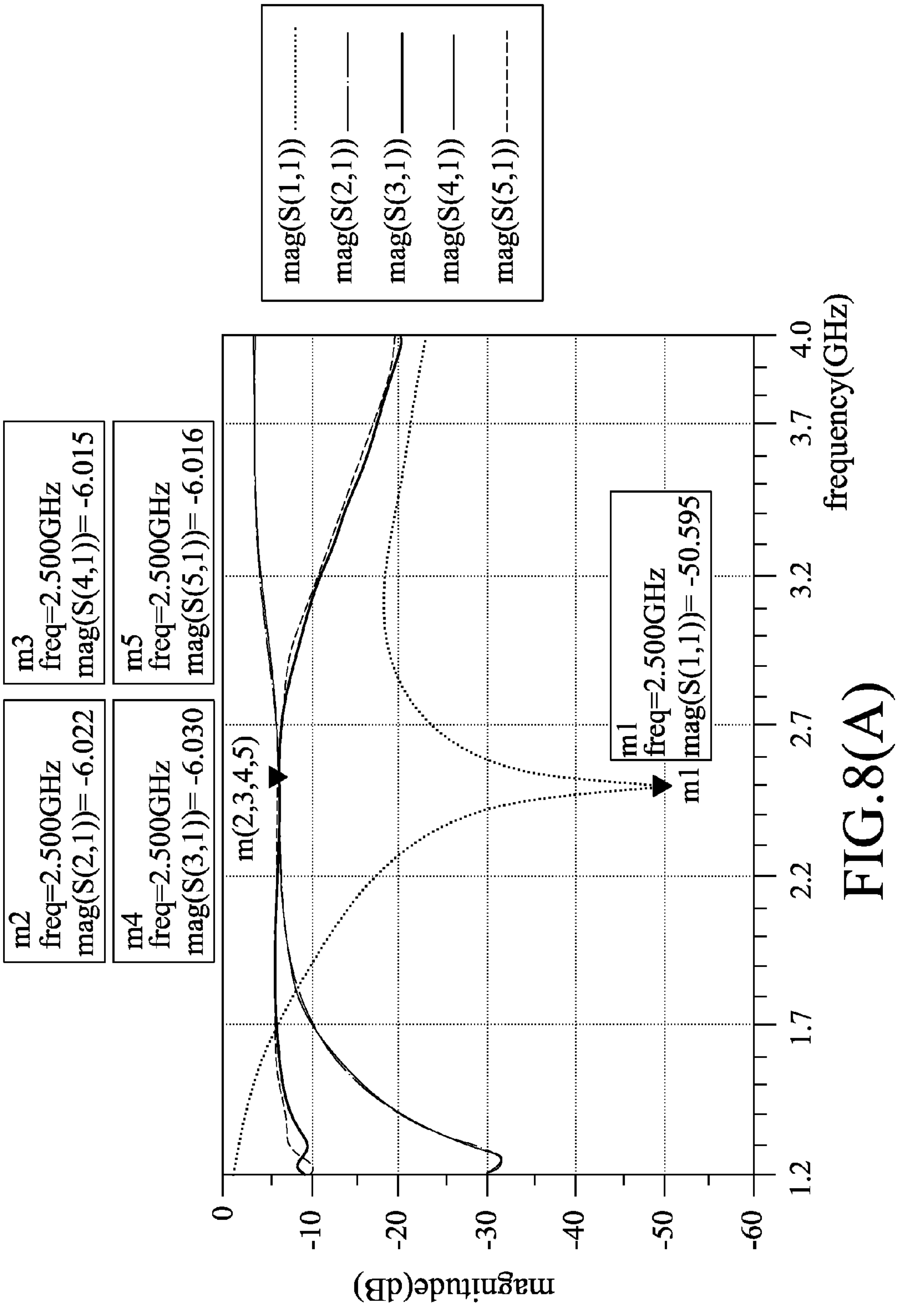
FIG. 8(A) is a graph illustrating magnitudes of various scattering parameters versus frequency characteristics of the first embodiment.
Figure 8B:
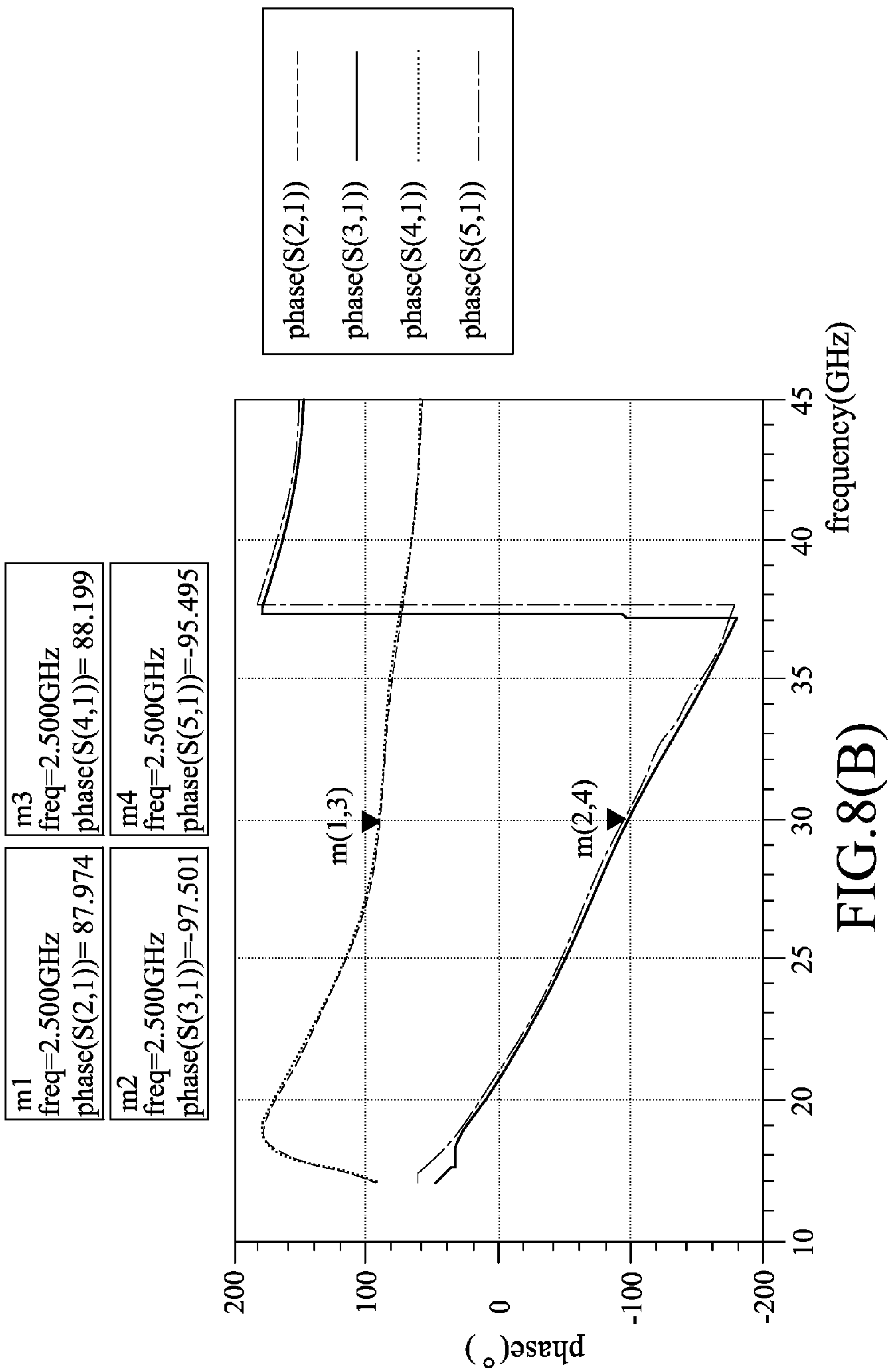
FIG. 8(*b*B) is a graph illustrating phases of various scattering parameters versus frequency characteristics of the first embodiment.

FIG. 8(A) illustrates simulation results of magnitudes of the scattering parameters (S(1,1)-S(5,1)). FIG. 8(B) illustrates simulation results of phases of the scattering parameters (S(1,1)-S(5,1)). It is known from FIGS. 8(A) and 8(B) that at the frequency of $3\times10^8/\lambda$, (e.g., 2.5 GHz), insertion losses from the first port (P1) respectively to the second to fifth ports (P2-P5) are respectively 6.022 dB, 6.030 dB, 6.015 dB and 6.016 dB, the return loss at the first port (P1) is 50.595 dB, and the phases of the scattering parameters (S(2,1)-S(5,1)) are respectively 87.974°, −97.501°, 88.199° and −95.495°. In other words, the amplitudes of the output signals outputted respectively at the second to fifth ports (P2~P5) are substantially equal, the phase difference between the output signals outputted respectively at the second and third ports (P2, P3) is substantially 180°, and the phase difference between the output signals outputted respectively at the fourth and fifth ports (P4, P5) is substantially 180°.

Figure 9:
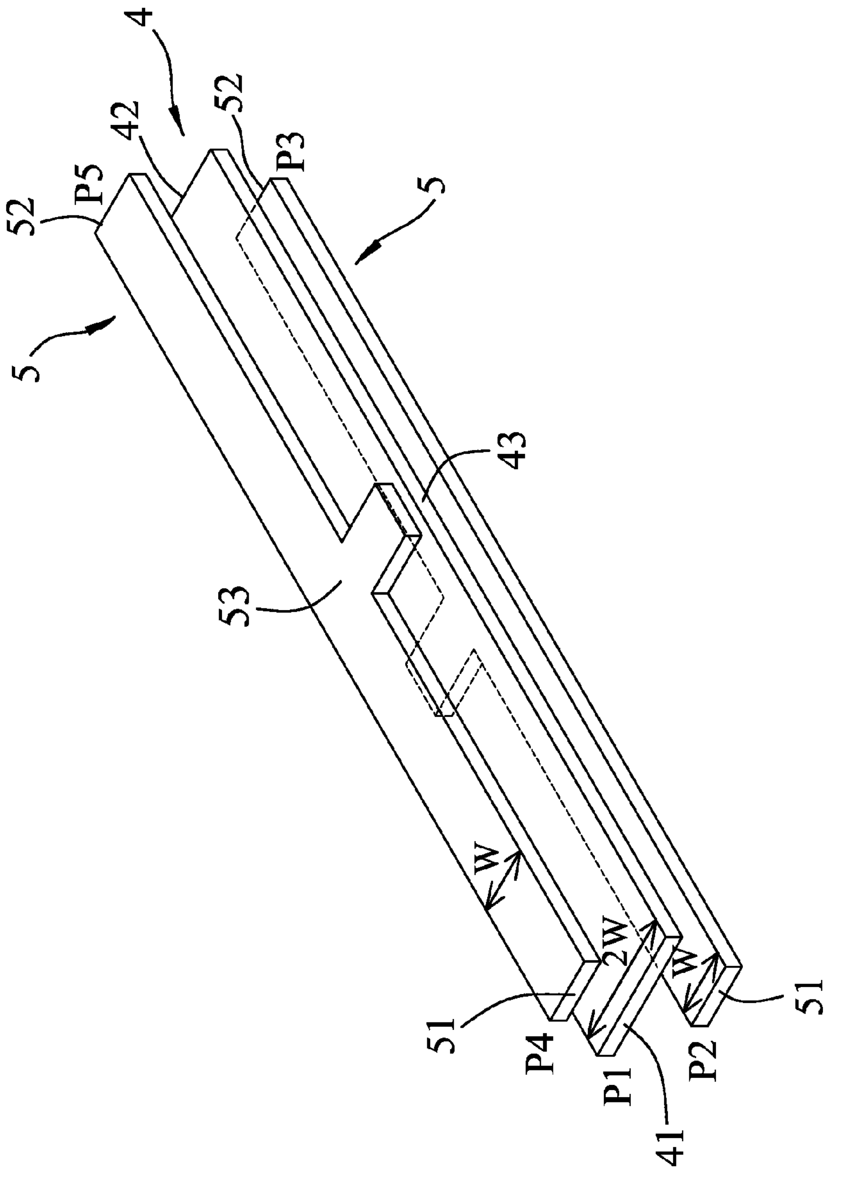
FIG. 9 is a structural diagram illustrating a second embodiment of a balun according to this disclosure.

Referring to FIG. 9, a second embodiment of a balun according to this disclosure differs from the first embodiment in that the first and second transmission lines 4, 5 of the second embodiment are non-coplanar with each other. In more detail, the first transmission line 4 and the second transmission lines 5 are aligned with and parallel to each other, and the second transmission lines 5 are equidistant from the first transmission line 4.

Figure 10:
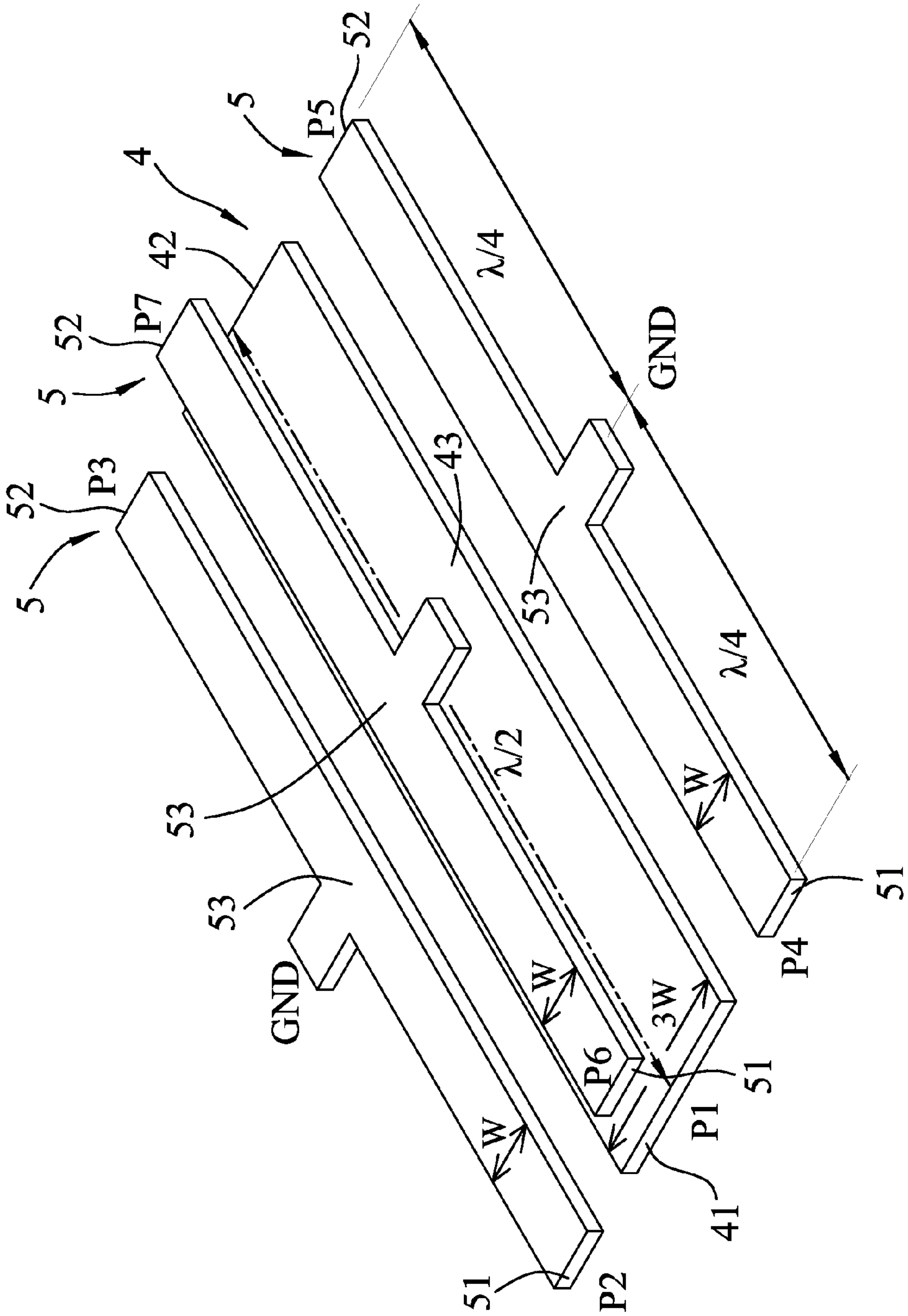
FIG. 10 is a structural diagram illustrating a third embodiment of a balun according to this disclosure.

Referring to FIG. 10, a third embodiment of a balun according to this disclosure differs from the first embodiment in that N=3, and that a third one of the second transmission lines 5 is non-coplanar with the first transmission line 4 and the first and second ones of the second transmission lines 5. In this embodiment, the third one of the second transmission lines 5 is aligned with an imaginary longitudinal central line of the first transmission line 4. In order to facilitate description of this embodiment, the first and second terminals 51, 52 of the third one of the second transmission lines 5 are respectively referred to as a sixth port (P6) and a seventh port (P7) hereinafter. It is noted that the third one of the second transmission lines 5 may be either above or under the first transmission line 4, and the distance between the first transmission line 4 and the third one of the second transmission lines 5 is not necessarily the same as that between the first transmission line 4 and the first or second one of the second transmission lines 5. In a case where the distance between the first transmission line 4 and the third one of the second transmission lines 5 is different from that between the first transmission line 4 and the first or second one of the second transmission lines 5, the width of the third one of the second transmission lines 5 may be adjusted to be different from the width of the first or second one of the second transmission lines 5 in order to achieve the same coupling effect per unit width.

Figure 11A:
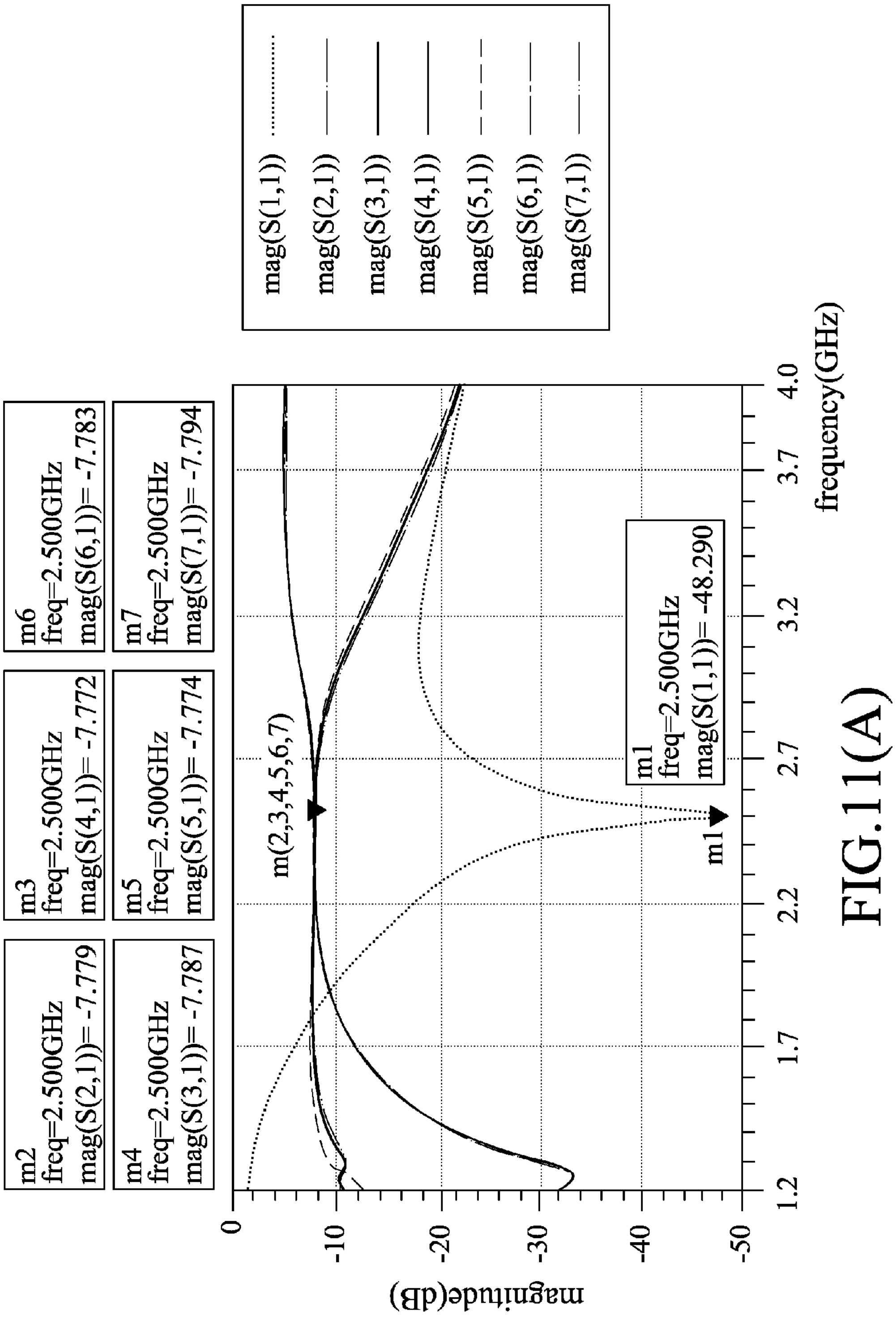
FIG. 11(A) is a graph illustrating magnitudes of various scattering parameters versus frequency characteristics of the third embodiment.
Figure 11B:
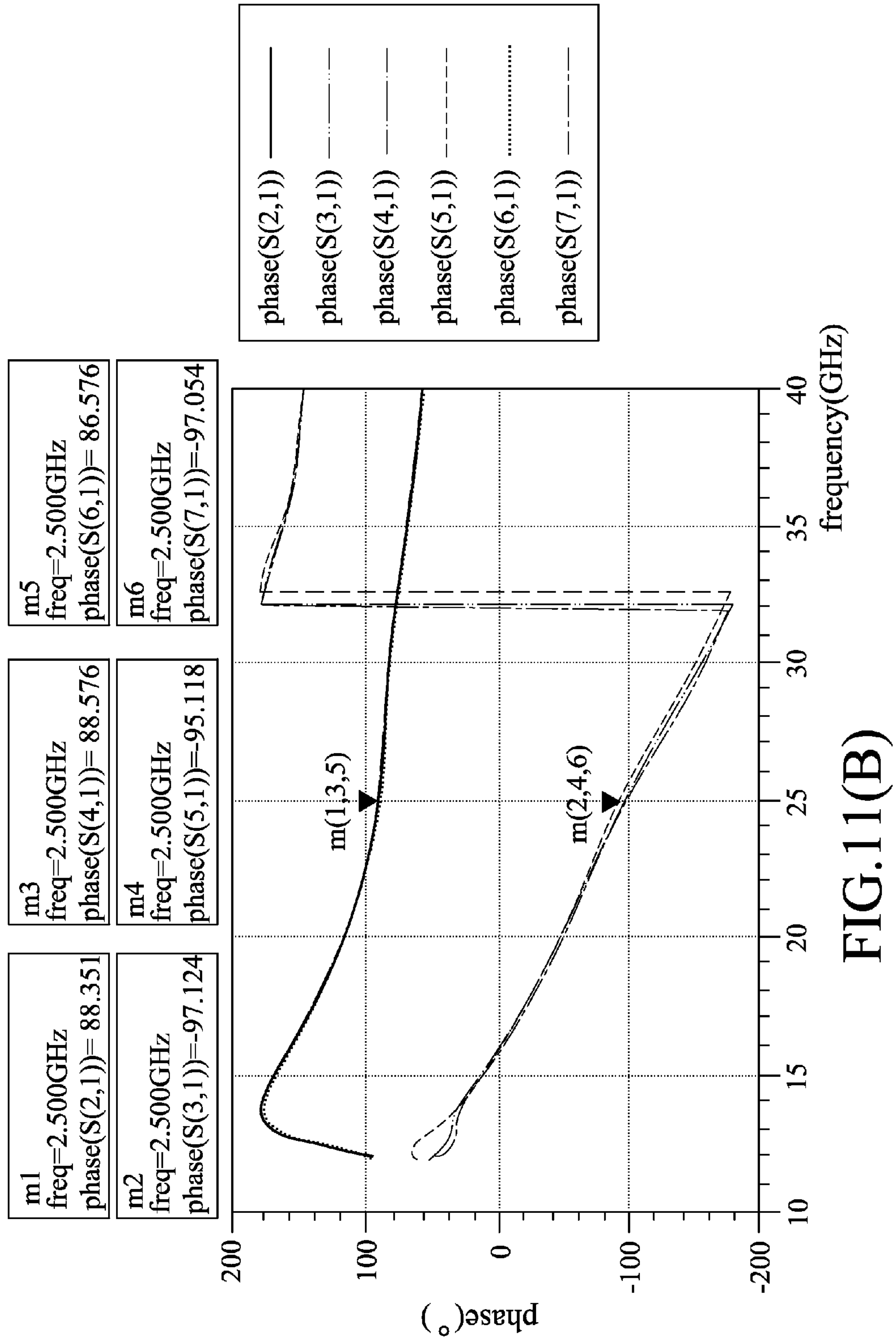
FIG. 11(B) is a graph illustrating phases of various scattering parameters versus frequency characteristics of the third embodiment.

FIG. 11(A) illustrates simulation results of magnitudes of the scattering parameters (S(1,1)-S(7,1)). FIG. 11(B) illustrates simulation results of phases of the scattering parameters (S(1,1)-S(7,1)). It is known from FIGS. 11(S) and 11(B) that at the frequency of $3\times10^8/\lambda$ (e.g., 2.5 GHz), the insertion losses from the first port (P1) respectively to the second to seventh ports (P2-P7) are respectively 7.779 dB, 7.787 dB, 7.772 dB, 7.774 dB, 7.783 dB and 7.794 dB, the return loss at the first port (P1) is 48.290 dB, and the phases of the scattering parameters (S(2,1)-S(7,1)) are respectively 88.351°, −97.124°, 88.576°, −95.118°, 86.576° and −97.054°. In other words, the amplitudes of the output signals outputted respectively at the second to seventh ports (P2-P7) are substantially equal, the phase difference between the output signals outputted respectively at the second and third ports (P2, P3) is substantially 180°, the phase difference between the output signals outputted respectively at the fourth and fifth ports (P4, P5) is substantially 180°, and the phase difference between the output signals outputted respectively at the sixth and seventh ports (P6, P7) is substantially 180°.

Figure 12:
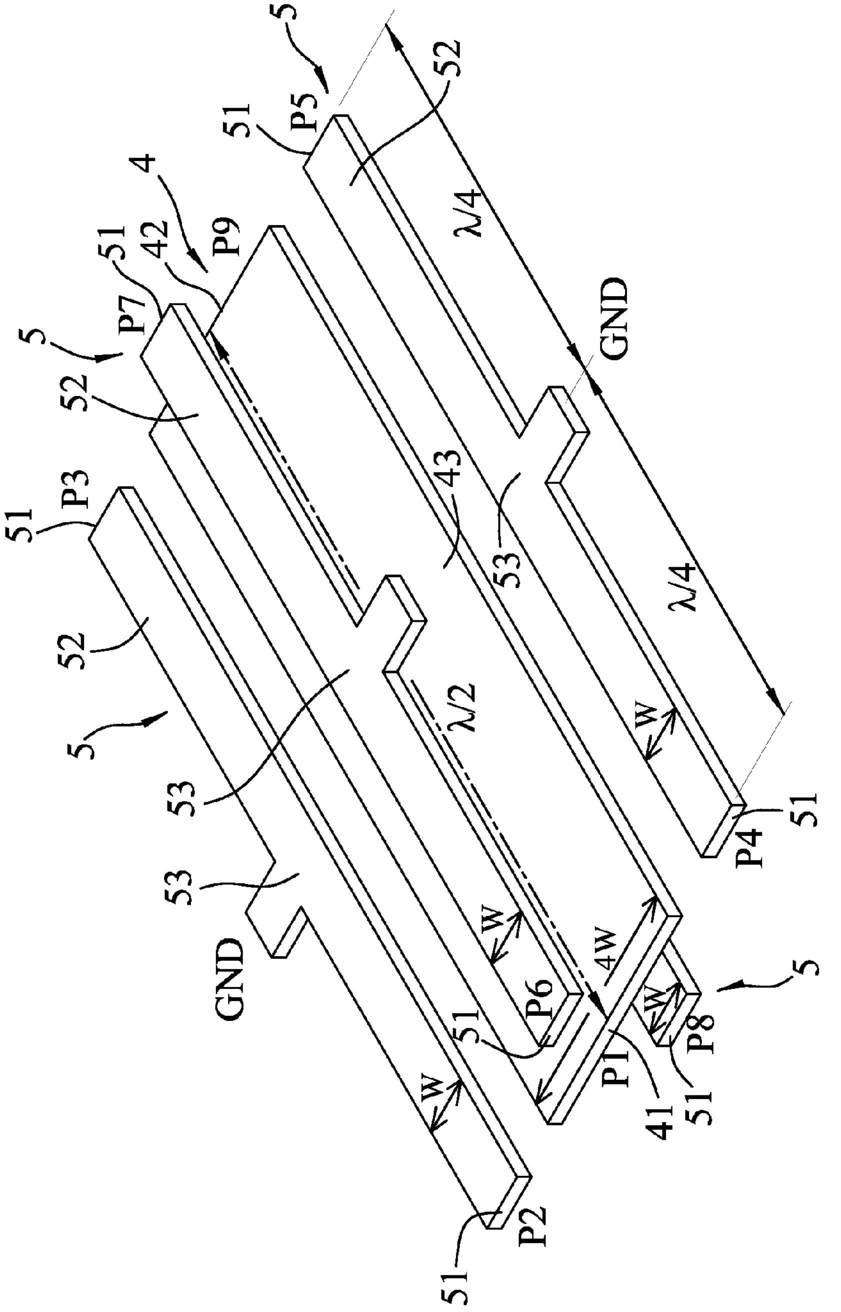
FIG. 12 is a structural diagram illustrating a fourth embodiment of a balun according to this disclosure.

Referring to FIG. 12, a fourth embodiment of a balun according to this disclosure differs from the third embodiment in that N=4, that a fourth one of the second transmission lines 5 is non-coplanar with the first transmission line 4 and the first to third ones of the second transmission lines 5, and that line bodies (i.e., the portion of the transmission line 5 other than the protrusive portion denoted as GND) of the third and fourth ones of the second transmission lines 5 are symmetrical with respect to the first transmission line 4. In more detail, the first transmission line 4 and the third and fourth ones of the second transmission lines 5 are aligned with and parallel to each other, and the third and fourth ones of the second transmission lines 5 are equidistant from the first transmission line 4, and are aligned with an imaginary longitudinal central line of the first transmission line 4. In order to facilitate description of this embodiment, the first and second terminals 51, 52 of the fourth one of the second transmission lines 5 are respectively referred to as an eighth port (P8) and a ninth port (P9) hereinafter. In this embodiment, the distance between the first transmission line 4 and the third or fourth one of the second transmission lines 5 is not necessarily the same as that between the first transmission line 4 and the first or second one of the second transmission lines 5. In a case where the distance between the first transmission line 4 and the third or fourth one of the second transmission lines 5 is different from that between the first transmission line 4 and the first or second one of the second transmission lines 5, the width of the third or fourth one of the second transmission lines 5 may be adjusted to be different from the width of the first or second one of the second transmission lines 5 in order to achieve the same coupling effect per unit width.

Figure 13A:
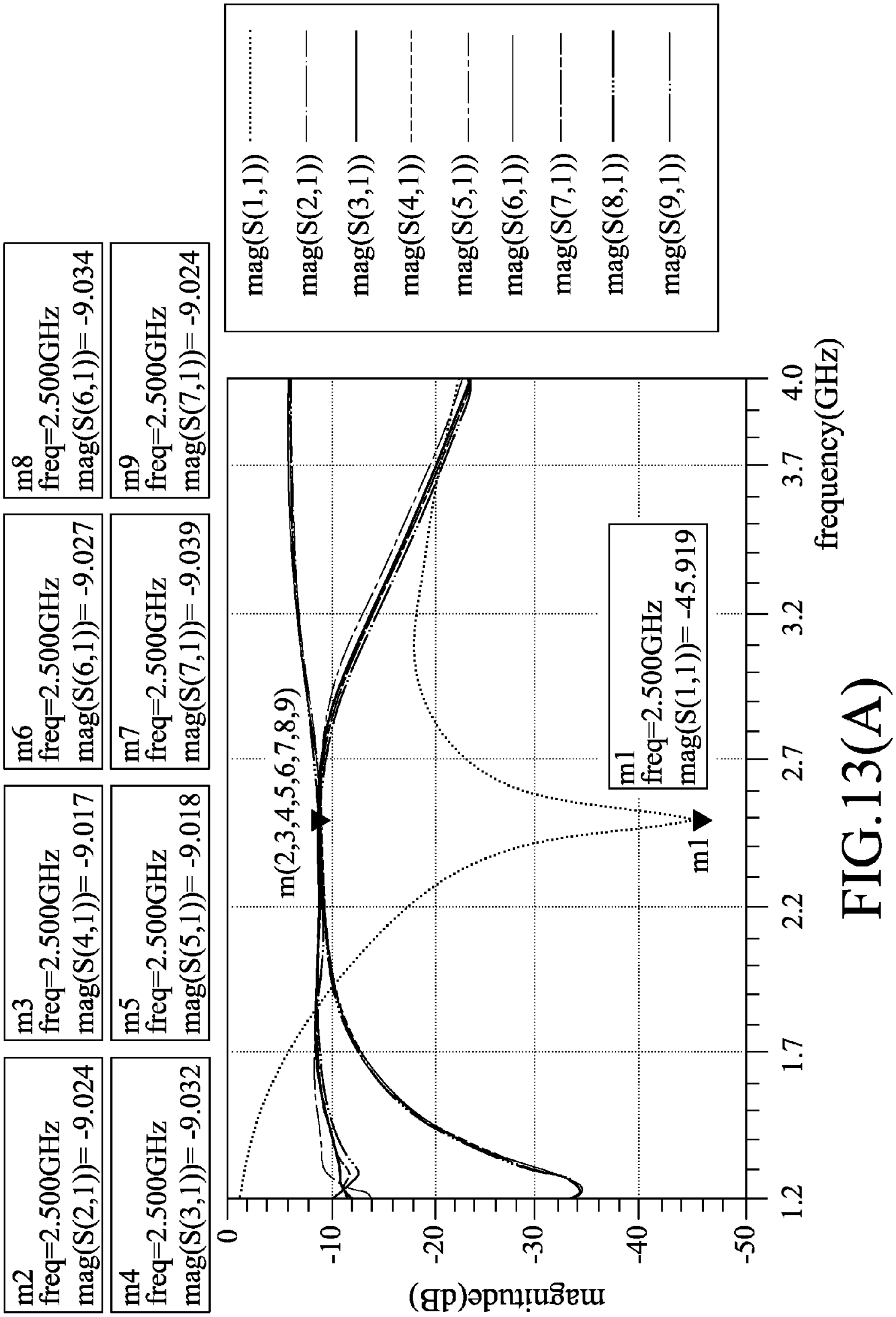
FIG. 13(A) is a graph illustrating magnitudes of various scattering parameters versus frequency characteristics of the fourth embodiment.
Figure 13B:
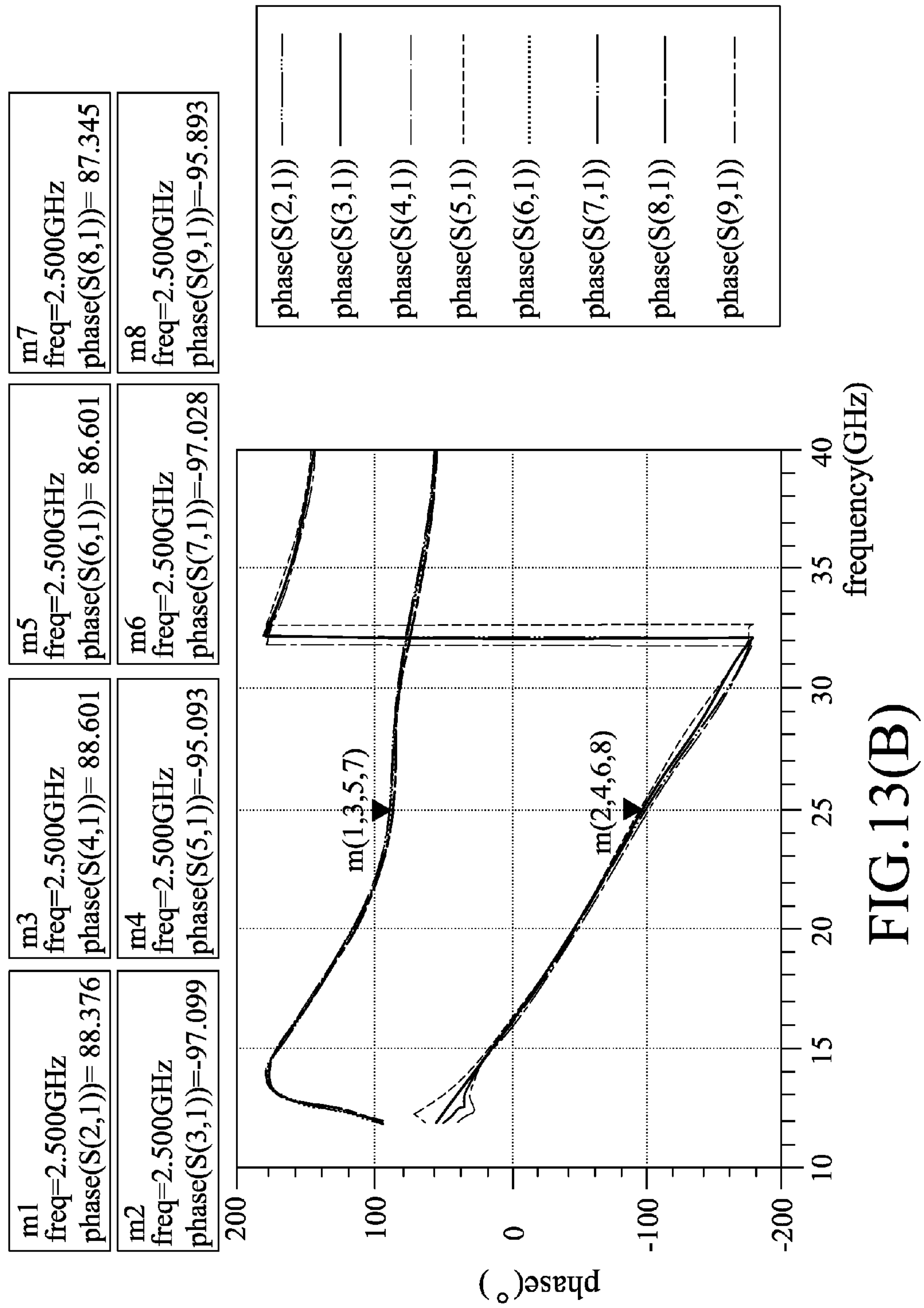
FIG. 13(B) is a graph illustrating phases of various scattering parameters versus frequency characteristics of the fourth embodiment.

FIG. 13(A) illustrates simulation results of magnitudes of the scattering parameters (S(1,1)-S(9,1)). FIG. 13(B) illustrates simulation results of phases of the scattering parameters (S(1,1)-S(9,1)). It is known from FIGS. 13(A) and 13(B) that at the frequency of $3\times10^8/\lambda$ (e.g., 2.5 GHz), the insertion losses from the first port (P1) respectively to the second to ninth ports (P2-P9) are respectively 9.024 dB, 9.032 dB, 9.017 dB, 9.018 dB, 9.027 dB, 9.039 dB, 9.034 dB and 9.024 dB, the return loss at the first port (P1) is 45.919 dB, and the phases of the scattering parameters (S(2,1)-S(9, 1)) are respectively 88.376°, −97.099°, 88.601°, −95.093°, 86.601°, −97.028°, 87.345° and −95.893°. In other words, the amplitudes of the output signals outputted respectively at the second to ninth ports (P2-P9) are substantially equal, the phase difference between the output signals outputted respectively at the second and third ports (P2, P3) is substantially 180°, the phase difference between the output signals outputted respectively at the fourth and fifth ports (P4, P5) is substantially 180°, the phase difference between the output signals outputted respectively at the sixth and seventh port (P6, P7) is substantially 180°, and the phase difference between the output signals outputted respectively at the eighth and ninth ports (P8, P9) is substantially 180°.

In view of the above, a number (N+1) of transmission lines 4, 5 (see FIGS. 2, 9, 10 and 12) are required in the balun of each embodiment to combine a number (2N) of input signals into an output signal, or to divide an input signal into a number (2N) of output signals. Therefore, the three Wilkinson power combiners 31-33 of the conventional power amplifier device shown in FIG. 1 can be replaced by a balun with three transmission lines (e.g., the first or second embodiment), and the three Wilkinson power dividers 11-13 of the conventional power amplifier device shown in FIG. 1 can be replaced by another balun with three transmission lines (e.g., the first or second embodiment), thereby decreasing the area and the cost of the conventional power amplifier device.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A balun comprising:

a first transmission line including an end terminal for receiving or outputting a signal with a target wavelength, and having a length of half the target wavelength; and a number (N) of second transmission lines, each of which is disposed adjacent to and spaced apart from said first transmission line so as to establish electromagnetic coupling therebetween, each of which includes a first end terminal and a second end terminal for cooperatively outputting or receiving a differential signal pair with the target wavelength, and a grounded central terminal, and each of which has a first length that is between said first end terminal and said central terminal thereof and that equals a quarter of the target wavelength, and a second length that is between said second end terminal and said central terminal thereof and that equals a quarter of the target wavelength, where N is an integer greater than or equal to two, wherein each of said second transmission lines has a width 1/N times that of said first transmission line.

2. The balun of claim 1, wherein said first and second transmission lines straightly extend in the same longitudinal direction thereof and are parallel to each other.

3. The balun of claim 2, wherein said first end terminal of each of said second transmission lines is aligned with said end terminal of said first transmission line.

4. The balun of claim 1, wherein N=2, said first and second transmission lines are coplanar with each other, and said first transmission line is disposed between said second transmission lines.

5. The balun of claim 3, wherein said second transmission lines are symmetrical with respect to said first transmission line.

6. The balun of claim 1, wherein N=2, said first and second transmission lines are non-coplanar with each other, and said first transmission line is disposed between said second transmission lines.

7. The balun of claim 6, wherein said first transmission line and said second transmission lines are aligned with and parallel to each other, and said second transmission lines are equidistant from said first transmission line.

8. The balun of claim 1, wherein N=3, and said first transmission line and two of said second transmission lines are coplanar with each other, and non-coplanar with the other one of said second transmission lines.

9. The balun of claim 8, wherein said the other one of said second transmission lines is aligned with an imaginary longitudinal central line of said first transmission line.

10. The balun of claim 1, wherein N=4, and said first transmission line and two of said second transmission lines are coplanar with each other, and non-coplanar with the other two of said second transmission lines.

11. The balun of claim 10, wherein said first transmission line and said the other two of said second transmission lines are aligned with and parallel to each other, and said the other two of said second transmission lines are equidistant from said first transmission line.

12. The balun of claim 11, wherein each of said the other two of said second transmission lines is aligned with an imaginary longitudinal central line of said first transmission line.

* * * * *